April 26, 1966 L. E. DICKENS 3,248,557

TRANSISTOR PARAMETRIC REACTANCE AMPLIFIER

Filed July 20, 1959

INVENTOR

Lawrence E. Dickens

BY Robert T. Killman

ATTORNEY

United States Patent Office 3,248,557

Patented Apr. 26, 1966

3,248,557

TRANSISTOR PARAMETRIC REACTANCE AMPLIFIER

Lawrence E. Dickens, Baltimore, Md., assignor to The Bendix Corporation, a corporation of Delaware Filed July 20, 1959, Ser. No. 828,409

2 Claims. (Cl. 307—88.3)

This invention relates generally to parametric amplifiers and more particularly to variational reactance type amplifiers and methods of obtaining composite amplification which employ a voltage variable capacitor in the form of a pn junction or similar semiconductor device.

Reactance amplifiers have recently gained considerable importance since the discovery that pn junction semiconductor devices of certain types exhibit a voltage variable capacitance which is almost lossless and which can be varied at extremely rapid rates including microwave rates. Since these devices represent a substantially pure capacitance they introduce no thermal noise in the circuits in which they are connected and since they can be varied at a microwave rate they offer the possibility of amplification at frequency ranges where an improvement in noise figure is a primary consideration for improving the sensitivity of amplifier devices.

The general arrangement of reactance amplifiers as presently known comprises a variable capacitance pn junction device connected to a plurality of circuits each selective to a particular frequency of a set of interrelated frequencies. One of the selector circuits is tuned to the signal frequency of the input, one of the circuits is tuned to the signal frequency of the output and the remaining circuits are tuned to the sum and/or difference frequencies generated between the input frequency and an auxiliary frequency known as the pump frequency. The various circuits are, in general, arranged to operate independently with respect to the particular frequency to which they are tuned and to eliminate the action of other frequencies on that branch of the circuit. With such an arrangement and the input and pump frequencies acting on the non-linear capacitor which is voltage variable, the frequency components which are present will include the input frequency, the pump frequency and the sum and difference frequencies of these two frequencies. Depending upon the use for which the circuit is to be put and the arrangement of the power absorbing circuits in the system, the device so described can be employed as an up-converter or a down-converter or as a straight amplifier. In the up-converter the output signal is taken as the sum or difference of the input and pump frequencies. In the down converter the input may be at the sum or difference between the pump and the output frequencies and for amplification the output may be taken at the input signal frequency.

The object of the present invention is to provide method and means for improved reactance amplification by providing a transistor output connection for a reactance amplifier.

A further object of this invention is to provide the combined cascaded gain of a reactance amplifier and a transistor amplifier using a single semiconductor device.

A further object of this invention is to provide a cascaded gain arrangement which operates with the low noise characteristic of a reactance amplifier in the first stage and provides the gain at signal frequency of a transistor in the second stage thereof.

These and other objects of the invention will become apparent from the following detailed description taken in conjunction with the accompanying drawing wherein.

In accordance with the present invention a reactance amplifier is operated using a variable capacitance pn junction in combination with a collector junction to provide reactance amplification and transistor amplification cascaded in a single semiconductor device.

Figure 1:
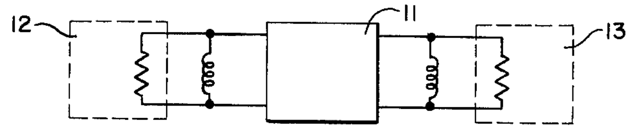
FIG. 1 is a representation of a conventional reactance amplifier device.

In FIG. 1 a generalized representation of a non-linear capacitance device is shown comprising a non-linear capacitor 11. Coupled to the capacitor 11 are generator or load devices 12, 13. As is known in the prior art, the devices 12 and 13 can supply a relatively low frequency and a relatively high frequency respectively to the capacitor 11 to produce an up-converter where the sum or difference frequency is coupled from the capacitor 11 by a suitable tuned circuit not shown. Alternatively, the capacitor 11 can operate as a negative conductance amplifier or oscillator in which case the sources 12, 13 have a frequency ratio of approximately 2:1 and the amplified signal corresponds in frequency to the lower frequency input. In conventional practice a circulator will be employed between the connection of signal source 12 and capacitor 11 and the output load, not shown, to separate the incident and amplified power from the capacitor 11.

Figure 2:
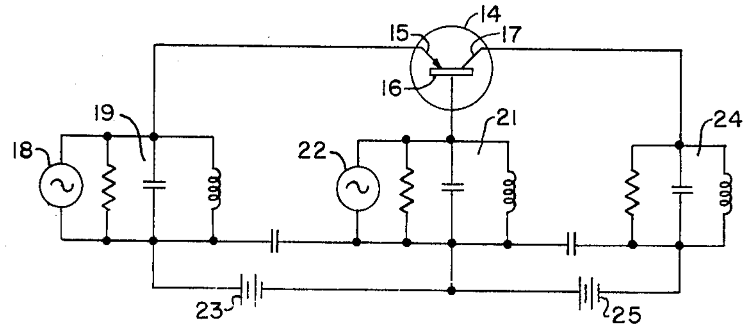
FIG. 2 is a schematic diagram of a reactance transistor amplifier in accordance with the invention for the degenerate mode.

Referring now to FIG. 2 the reactance amplifier employing a transistor 14 is shown. The transistor 14 has an emitter 15 and a base 16 which form an emitter-base diode that exhibits a non-linear capacitance-voltage characteristic. The transistor 14 has a collector electrode 17. One suitable form of transistor 14 provides the electrodes 15, 16 and 17 preferably of the diffused junction type. As is well known, semiconductor devices of this type may employ silicon, germanium or other suitable materials and may be either pnp or npn arrangements, the difference in biasing polarities for the two types being a matter of common knowledge in the art.

The emitter 15 is driven by an input signal from a generator 18 which is coupled to a parallel tuned circuit 19 tuned to the frequency thereof. The frequency of generator 18 may be in the high frequency range up to the kilomegacycle region. The base 16 is connected to a parallel tuned circuit 21 which is driven by a generator 22 generating a frequency which is twice that of the frequency of generator 18. With this arrangement and a suitable bias potential applied to the emitter-base diode by a bias source 23, the non-linear capacitance characteristic of the emitter-base diode will introduce a negative resistance into the circuit including the sources 18 and 22 and the associated circuits 19, 21 tuned to the respective frequencies. Since the ratio of the frequencies of the sources 18 and 22 is 2 to 1 the difference frequency therebetween is equal to the resonant frequency of the circuit 19 thus providing a tuned circuit for the difference frequency without additional circuit structure. This degenerate case of the general arrangement of a reactance amplifier will produce amplification at the signal frequency of generator 18 which is also the difference frequency between generator 22 and generator 18 with the value of the negative resistance controlled by the parameters of the circuit and the amplitude of the pumping power. With sufficient negative resistance the circuit becomes unstable and will sustain free oscillations at this frequency.

In accordance with the present invention the reactance amplification obtained in the emitter-base diode of transistor 14 is effective as an input signal to the emitter-base circuit of transistor 14 operating as a transistor amplifier. Accordingly, the reactance amplified signal which is present in the emitter-base circuit is amplified through the transistor 14 by transistor action to the collector electrode 17. In order to utilize the signal in this manner a circuit 24 tuned to the frequency of generator 18 is connected in circuit with the collector 17, and a source of potential 25 is provided properly to bias collector 17 for transistor amplification. With this arrangement the amplification by capacitive reactance variation in the emitter-base circuit of transistor 14 is augmented by the additional power gain from the emitter to collector electrodes of transistor 14 to produce an output signal in circuit 24 of the frequency of generator 18 enhanced by the cascaded gains of the reactance amplifier and the transistor amplifier. Since the reactance amplification occurs in the emitter circuit of transistor 14, the signal from generator 18 is increased in level by the gain of the reactance amplifier prior to being injected into the circuit of collector 17. Accordingly, the low noise figure of the reactance amplifier is preserved since the signal from generator 18 is amplified prior to its introduction into the more noisy collector circuit.

Figure 3:
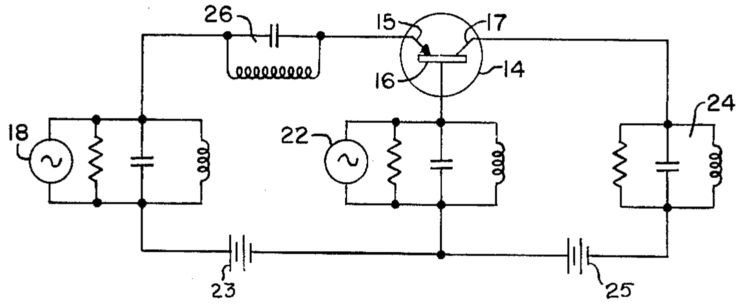
FIG. 3 is a schematic diagram of a reactance transistor amplifier in accordance with the invention including a separate idler circuit.

In FIG. 3 a generalized form of circuit is shown corresponding to the degenerative case of FIG. 2. The circuit of FIG. 3 corresponds generally to that of FIG. 2 except for the addition of a tuned circuit 26 which is tuned to the difference frequency between generators 22 and 18. In the circuit of FIG. 3 the relation between the input frequency of generator 18, which may be a signal source, and the frequency of generator 22, which supplies the pump power, need not be in any particular ratio. With this arrangement the sum or difference frequency depending upon the mode of operation of the circuit is supported by a tuned circuit 26 which is tuned to the sum or difference frequency and represents the idler circuit of the reactance amplifier. Operating the circuit of FIG. 3 as a negative resistance amplifier, the circuit 26 is tuned to the difference frequency of generators 22 and 18. For this operation, the circuit 24 is tuned to the same frequency as the signal source 18 and represents the useful output of the amplified signal after enhancement by negative resistance amplification and transistor amplification in the manner described with reference to FIG. 2. To operate as an up-converter the circuit of 24 would be tuned to the frequency of the idler circuit 26 representing the sum or difference of the frequencies of sources 22 and 18 whereby the amplified version of the signal 18 would appear across the circuit 24 translated to the upper or lower side band of the combined frequencies. These modes of operation represent the preferred modes for reactance amplification but are not exhaustive of the possibilities. Output power at other combinations of the input frequencies can be obtained by properly selecting the resonant frequency of circuit 24. By tuning circuit 24 to what has been considered the input frequency, and reversing the role of circuits 18 and 26, i.e. bring the signal in at the idler circuit, a down-converted can be effected. Since the down-converted in a reactance amplifier generally entails a loss corresponding to the ratio of the frequencies involved in much the same manner that the up-converter produces a gain corresponding to the ratio of the frequencies involved, it is generally more satisfactory to use a variable conductance type device rather than a variable capacitance device for down conversion.

Figure 4:
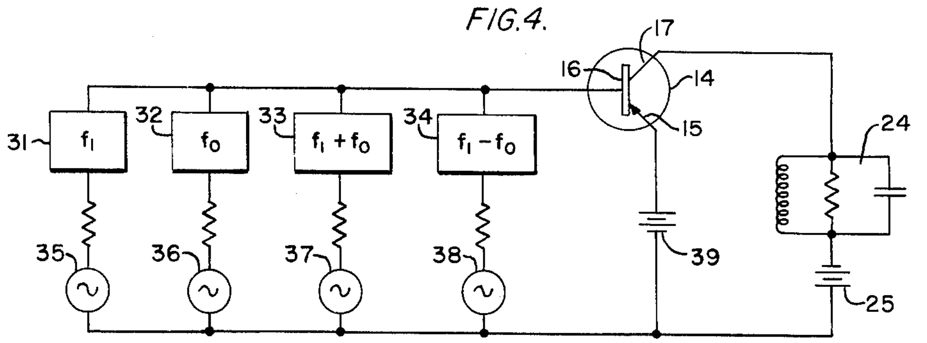
FIG. 4 is a modification of the reactance transistor amplifier.

FIG. 4 shows a modified version of the transistor reactance amplifier of the invention in which a plurality of branch circuits provide the various frequency signal paths. Thus a filter 31 is effective to provide a signal path for frequency $f_1$ while blocking all other frequencies and in like manner a filter 32 passes frequency $f_0$ while blocking all other frequencies. A filter 33 passes frequency $f_1+f_0$, and blocks all other frequencies and a filter 34 passes frequency $f_1-f_0$ and blocks all other frequencies. Each of the filters 31, 32, 33, 34 is connected to a generator 35, 36, 37, 38 which generates the frequency corresponding to the filter to which it is connected and includes an internal resistance. The amplitude supplied by the generators 35, 36, 37, 38 may be variable and may include the value of zero amplitude. The branch circuits for the frequencies $f_1$, $f_0$ and the sum and difference frequencies are connected to the transistor 14 between the base 16 and the emitter electrode 15. The transistor 15 is again selected as one having a non-linear capacitance variation for the emitter-base diode and thus with the circuit connected between emitter 15 and base 16 can provide capacitive reactance amplification of any desired mode by suitably selecting the input and pump frequencies among the various branch circuits. The transistor 14 is selected for providing the non-linear capacitance variation in the emitter-base diode under the same bias conditions which the transistor 14 requires for transistor amplification bias between the emitter 15 and base 16. This bias may be provided by a battery 39 with or without a series bias resistor. The useful output signal from transistor 14 is selected by a tuned circuit 24 coupled to collector electrode 17. Suitable collector bias from a source 25 is supplied to collector 17 for transistor gain operation.

While particular embodiments of the invention have been disclosed it will be understood that many modifications thereof can be made without departing from the spirit and scope of the invetnion. In general, the modification in accordance with the invention can be applied to any reactance amplifier in which a collector junction can be incorporated and in which transistor action is available with the biases which are required to obtain reactance amplification.

Without limiting the invention in any way the following results are indicative of the operation of the invention in a circuit corresponding to that of FIG. 2. A 2N509 transistor was connected in a circuit corresponding FIG. 2 and a gain at 425 megacycles of 10 db was obtained with no pump power. Upon the introduction of an 850 megacycle pump generator 22 the gain was increased 10 db and the overall noise figure of the combined amplifier was reduced by several db. For this circuit the battery 23 was approximately 0.3 volt and the battery 25 was 10 volts. The magnitude of the pump power supply by generator 22 was approximately 2.0 volts.

Many modifications will occur to those skilled in the art in the light of the present disclosure and the invention is to be limited therefor only by the scope of the appended claims.

I claim:

1. A composite amplifier comprising a first semiconductor p-n junction exhibiting a voltage variable non-linear capacitance, means for coupling an input signal of a first frequency across said junction, means for applying pump voltage of a second higher frequency across said junction, a tuned circuit connected to said junction for supplying a resonant impedance across which appears an amplified replica of said input signal at a frequency of $mf_p \pm nf_1$ where $f_p$ is said pump frequency, $f_1$ is said input frequency and $m$ and $n$ are any integers, a second p-n junction formed on one side of and spaced from said first junction, a load circuit connected to said second junction on the side remote from the side common to both junctions and tuned to said $mf_p \pm nf_1$ frequency and means for biasing said junctions to obtain in said load circuit transistor amplification of said amplified replica.

2. An up-converter comprising a first p-n junction exhibiting voltage variable non-linear capacitance, means including an idler circuit for applying pump and signal power to said junction for producing an amplified signal at a combined frequency equal to the algebraic sum of integral multiples of said pump and signal frequencies, a second p-n junction formed on one side of and spaced from said first junction, said first and second junctions being biased for transistor amplification of said amplified signal, and a load circuit connected to said second junction and tuned to said combined frequency.

References Cited by the Examiner

UNITED STATES PATENTS

| | | | |
|---|---|---|---|
| 2,713,665 | 7/1955 | Raisbeck et al. | 332—31 |
| 2,841,703 | 7/1958 | Bopp. | |
| 2,853,603 | 9/1958 | Herold | 330—31 |

FOREIGN PATENTS

| | | | |
|---|---|---|---|
| 318,086 | 1/1957 | Switzerland. | |

ROY LAKE, *Primary Examiner.*

ELI SAX, L. MILLER ANDRUS, BENNETT G. MILLER, *Examiners.*